United States Patent [19]
Duane et al.

[11] Patent Number: 5,183,972
[45] Date of Patent: Feb. 2, 1993

[54] COPPER/EPOXY STRUCTURES

[75] Inventors: Diana C. Duane, Cedar Park, Tex.; Eric L. Zilley, St. Paul, Minn.; Robert C. Jordan, White Bear Lake, Minn.

[73] Assignees: Microelectronics and Computer Technology Corporation, Austin, Tex.; Minnesota Mining and Manufacturing Company, St. Paul, Minn.

[21] Appl. No.: 650,137

[22] Filed: Feb. 4, 1991

[51] Int. Cl.$^5$ .............................................. H05K 1/00
[52] U.S. Cl. ..................................... 174/251; 174/256
[58] Field of Search ............... 174/250, 254, 255, 256, 174/251, 257, 258; 361/397, 398, 414; 29/832, 846; 526/242

[56] References Cited

U.S. PATENT DOCUMENTS

| | | | |
|---|---|---|---|
| 2,951,825 | 9/1960 | Reinking et al. | 260/47 |
| 3,909,680 | 9/1975 | Tsunashima | 174/256 X |
| 4,294,877 | 10/1981 | Graham | 428/209 |
| 4,299,863 | 11/1981 | Tanimoto et al. | 427/140 |
| 4,394,419 | 7/1983 | Konicek | 428/416 |
| 4,503,112 | 3/1985 | Konicek | 428/216 |
| 4,503,211 | 3/1985 | Robins | 528/92 |
| 4,511,757 | 4/1985 | Ors et al. | 174/68.5 |
| 4,556,628 | 12/1985 | Greschner et al. | 430/314 |
| 4,628,022 | 12/1986 | Ors et al. | 430/280 |
| 4,684,678 | 8/1987 | Schultz et al. | 523/466 |
| 4,707,534 | 11/1987 | Schultz | 528/97 |
| 4,719,255 | 1/1988 | Yoshizumi et al. | 523/436 |
| 4,720,515 | 1/1988 | Iji et al. | 523/435 |
| 4,743,651 | 5/1988 | Shibuya et al. | 525/92 |
| 4,763,188 | 8/1988 | Johnson | 357/74 |
| 4,770,992 | 9/1988 | Van den Engh et al. | 435/6 |
| 4,795,693 | 1/1989 | Ors et al. | 430/312 |
| 4,810,332 | 3/1989 | Pan | 204/15 |
| 4,816,323 | 3/1989 | Inoue | 428/200 |
| 4,899,439 | 2/1990 | Potter | 174/255 X |
| 4,918,811 | 4/1990 | Eichelberger et al. | 29/840 |
| 4,993,148 | 2/1991 | Adachi | 174/252 X |
| 5,037,917 | 12/1991 | Babb et al. | 526/242 |
| 5,103,293 | 4/1992 | Bonafina et al. | 174/256 |

OTHER PUBLICATIONS

Bauer, "High Performance Epoxy Resin Systems," 33rd International SAMPE Symposium Mar. 7–10, pp. 1385–1393.

Wang et al., "High Performance Epoxy Resins For Composites and Structural Adhesive Applications," 33rd International SAMPE Symposium Mar. 7–10, 1988, pp. 484–492.

Portelli et al., "High Performance Fluorene Resins and Their Composites," Twentieth International SAMPE Technical Conference, Sep. 1988, pp. 576–589.

Jordan et al., "Moisture Effects in Fluorene Thermoset Resins," Twentieth International SAMPE Technical Conference, Sep. 1988, pp. 576–589.

Jensen et al., "Recent Advances in Thin Film Multilayer Interconnect Technology of IC Packaging," Materials Research Society Symposium Proceedings, vol. 108 (1988), pp. 73–79.

Hornig, "Printed Circuit Backplane Design and Impendance Control," Seventeenth Annual Connectors and Interconnection Technology Symposium Proceedings, Sep. 19–21, 1984, pp. 493–501.

Wang, "Advanced Materials for Printed Circuit Boards," Materials Research Symposium Proceedings, vol. 108, 1988, pp. 125–139.

Coombs, Printed Circuits Handbook, McGraw-Hill, Inc., Second Edition 1979, pp. 18-10 to 18-15.

Schultz, "Fluorene Containing Thermosetting Resins," International Encyclopedia of Composites, vol. 2, pp. 101–105; S. M. Lee (Ed.) VCH Publishers, New York, N.Y., 1990.

Primary Examiner—Leo P. Picard
Assistant Examiner—Trinidad Korka
Attorney, Agent, or Firm—David M. Sigmond

[57] ABSTRACT

A high density, high performance circuit fabricated with a copper/epoxy structure. The circuit is well suited for an integrated circuit interconnect device. Fluorene-containing epoxy resins may be used to obtain certain material and processing advantages over copper/polyimide structures. The circuit structure resides on a substrate which may be ceramic, a semiconductor such as silicon, or, advantageously, a cured epoxy resin.

22 Claims, 6 Drawing Sheets

COPPER/EPOXY STRUCTURES

BACKGROUND OF THE INVENTION

1. Field of the Invention

The invention relates to an interconnect structure utilizing copper conductive layer separated by a cured epoxy resin dielectric material, and more particularly to a high density circuit suitable for use as an interconnect device for integrated circuits.

2. Description of the Related Technology

Integrated circuit technology has advanced to where chip-to-chip interconnect delay and line density are limiting factors in the overall performance and size of an integrated module. A high density, high performance alternative to conventional printed circuit (PC) board interconnects is required to address certain deficiencies in printed circuit board chip-to-chip interconnect structures.

Conventional PC board interconnects have been constructed of laminated materials made from glass impregnated with epoxy resin, an example of which is designated "FR-4," a classification representing a flame retardant bisphenol-A-based epoxy resin with a glass transition temperature of 120–150° C. after curing. The line density of a single layer PC board is limited by surface characteristics, such as pits and dents in the laminated foil, print-through of the fabric weave pattern in the foil, and bow and twist features of the overall laminate, to about 200 lines per inch per level. Plated through-holes consume large amounts of board area, severely reducing the board area available for interconnect lines. Copper/organic polymer type structures made with 1970's integrated circuit fabrication equipment and techniques can be fabricated with densities of over 500 lines per inch per level, reducing line lengths and signal propogation delay, and allowing higher packaging density.

Microelectronics and Computer Technology Corporation (MCC), an assignee of the present invention, has developed high density, high performance interconnect systems in which integrated circuit interconnect circuits fabricated from a copper/polyimide structure are utilized to significantly reduce delays and cross-talk or noise. Such systems are described in U.S. Ser. Nos. 07/102,172 and 07/158,172, the disclosures of which are incorporated by reference. Copper/polyimide interconnects may be fabricated with either stacked of staggered vias and may be in a set or predetermined circuit pattern or customizable. The copper/polyimide interconnects represent a significant advance over the prior technology. However, they suffer certain fabrication limitations based on the material characteristics of the polyimide. Polyimide is hygroscopic and therefore requires in-process dehydration bake steps during fabrication. Furthermore, copper conductors require an overcoat in order to prevent undesirable copper/polyimide interactions, for instance oxidation and/or corrosion of the copper, and loss of adhesion strength of the polyimide to the copper.

SUMMARY OF THE INVENTION

It is an object of the present invention to provide a high density, high performance interconnect utilizing a copper/cured epoxy resin structure.

It is a further object of the present invention to enhance manufacturing ease of an electrical interconnect and to avoid the fabrication steps of in-process dehydration bakes and overcoating of the conductive copper structures by using a cured epoxy resin as a dielectric material.

A still further object of the present invention is an improved dielectric for use an as interfacial layer for multilayered circuit construction which comprises any cured epoxy resin comprised of one of more polyepoxides, one or more curing agents, and other optional compounds in which the glass transition temperature (Tg) of the cured epoxy resin composition is sufficiently high (at least 175° C.) to enable the cured composition to survive elevated processing temperatures, such as those encountered in the sputter deposition of metals, without undue adverse effects. Preferred compositions are comprised of a fluorene-containing component, such as the polyepoxide or the curing agent.

Unfortunately, universal agreement of the terminology used in the field of epoxy resins has not been reached. The term "epoxy resin" has been used to indicate not only molecules containing at least one group having a three-membered ring of which one member is oxygen, but also the cured compositions in which the three-membered ring no longer exists. As used herein for the present invention, the term "polyepoxide" will be used to mean a molecule that contains more than one

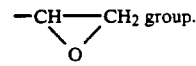
—CH——CH$_2$ group.
   \\  /
    O

The term "epoxy resin" will be used to mean uncured compositions comprising a polyepoxide, a curing agent, and other optional compounds that can be cured into a "cured epoxy resin".

According to another aspect of the present invention, the high density interconnect may advantageously be a multi-layer circuit residing on a carefully chosen substrate. The substrate utilized can be a ceramic, a semiconductor such as silicon, or a cured epoxy resin structure. The circuit or electrically conductive layers are preferably copper, although other suitable electrical conductors include gold, aluminum, silver or a refractory metal.

In accordance with still another aspect of the present invention, a line density of over 300 lines per inch per level, preferably 500 lines per inch per level, can advantageously be obtained over PC board technology conductor line densities which normally are limited to about 200 lines per inch per level.

A further object of the present invention includes a circuit made up of a plurality of circuit layers, thermal vias, power channels, and top level structures to accommodate a variety of integrated circuit configurations. The layers can be arranged so that they are connected in a predetermined and desirable fashion in order to define the desired circuit structure. Additionally, multiple reference or power layers can be utilized in the circuit.

Those epoxy resins suitable for the present invention which contain the fluorene structure either in the polyepoxide component or in the curing agent process in a manner similar to conventional high performance epoxy resins, but due to the structure of the fluorene moiety, provide for the formulation of cured materials with a unique combination of high glass transition temperature, increased ductility (crack resistance), and low moisture absorption. These resins, their properties, and their development have been disclosed by Minnesota Mining and Manufacturing Company (3M), an assignee of the present invention, in the papers "High Performance Fluorene Resins and Their Composites" by Portelli, Schultz, Jordan and Hackett, Twentieth International SAMPE Technical Conference, Sep. 1988, pp. 20-33; and "Moisture Effects in Fluorene Thermoset Resins" by Jordan, Baker, Schultz and Portelli, Twentieth International SAMPE Technical Conference, Sep. 1988, pp. 576-589, each of which is incorporated by reference.

A significant advantage of certain cured epoxy resins is that their moisture absorption is lower than cured polyimide. The weight change of a cured thin film of conventional polyimide such as DuPont 2525 is reported to be 3-4% after 24 hours of exposure at 25° C. and 100% relative humidity. The weight change of 3M's fluorene-containing cured epoxy resins, after exposure to conditions of high temperature and high humidity, have been found to be approximately 2% or less at equilibrium. This lower moisture absorption increases the manufacturability and reliability of copper/epoxy structures as compared to copper/polyimide constructions. An example of the improved manufacturability associated with cured epoxy resins is the elimination of in-process dehydration bakes that are required when polyimide is the dielectric.

Furthermore, it has been reported that the interfacial adhesion between copper and polyimide is weak due to the formation of copper oxide and other copper/polyimide reaction products at the interface. Deleterious reactions between the polyimide and the copper indicative of corrosion are often detected by discoloration of the copper after the polyimide is cured. As a result, it is frequently necessary to deposit an overcoat on the copper conductor surface to prevent such reaction products. Protective overcoats including copper oxides, nickel, and titanium are common. Unfortunately, these overcoats add complexity to the process sequence and can easily increase the number of fabrication steps by 30%, especially when considering that most overcoat processes require the removal of native copper oxide immediately prior to applying the overcoat.

An advantage of the present invention copper/cured epoxy resin device is the ability to resist oxidation/corrosion up to cure temperatures of 200° C. The lack of observable deleterious reactions between copper and epoxy resin during the epoxy cure allows for the elimination of protective overcoats.

Yet another advantage of a cured epoxy resin dielectric is its excellent adhesion both to itself and to numerous other materials, in particular copper conductors.

According to a particularly advantageous embodiment of the present invention, the same epoxy resin used as a dielectric can also be used to fabricate an underlying substrate or base. This feature results in a thermal coefficient of expansion of the dielectric is identical to that of the substrate, thereby eliminating substrate bow caused by thermal mismatch of materials, and reducing related concerns during thermal cycling. The small percentage of area covered by the metal conductor as compared to that covered by the dielectric in any particular layer will not have a significant effect on the thermal coefficient of expansion. Normally, even in high density interconnect systems, less than 30% of the available area is taken up by a metal conductor. The cured epoxy resin substrate may be fabricated by conventional procedures, such as curing the epoxy resin in a sheet-like structure or machining previously cured epoxy resin to an appropriate configuration.

Characteristic impedance, cross-talk, and line density are three of the most important considerations in the design of an electrical interconnect system. The characteristic impedance is affected by the dielectric constant, the dielectric thickness, the conductor width, and the conductor thickness. The performance of an interconnect is ultimately limited by the resistivity of the conductor and the dielectric constant of the dielectric material. If a dual stripline model is used, applicant has calculated a characteristic impedance of about 56 ohms for cured DuPont 2525 polyimide (dielectric constant = 3.5); and a characteristic impedance of about 51 ohms for cured epoxy resin (dielectric constant = 4.2). An epoxy dielectric material can be used to create a 60 ohm controlled impedance substrate by changing the distance between the conductor and reference planes, and the distance between the conductors on separate levels, each to 20 microns. A spacing of 20 microns between conductors can be achieved with a cured epoxy resin dielectric, so a dielectric constant as high as 4.2 provides for an acceptable system.

DETAILED DESCRIPTION OF PREFERRED EMBODIMENT

Figure 1:
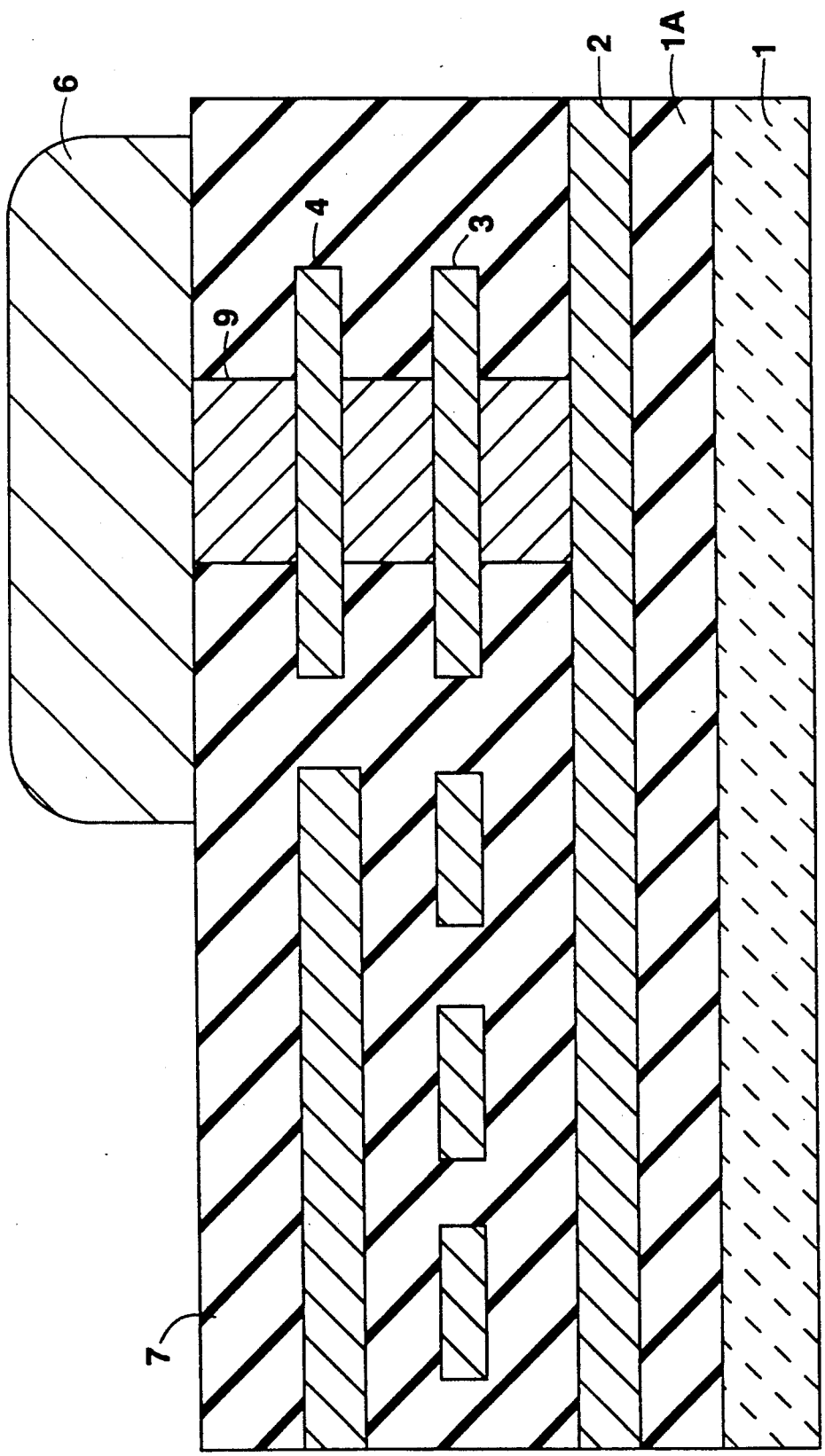
FIG. 1 shows a schematic drawing section of an interconnection device according to the invention.

Background information on epoxies can be found in U.S. Pat. Nos. 4,707,534 and 4,684,678 which are hereby incorporated by reference. The polyepoxides suitable for the present invention are compounds in which there is present more that one epoxy group, e.g.,

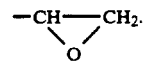

Such polyepoxides include, but are not limited to, polyglycidyl ethers of polyhydric phenols, for example pyrocatechol; resorcinol; hydroquinone; 4,4'-dihydroxydiphenyl methane; 4,4'-dihyroxydiphenyl dimethyl methane; 4,4'-hydroxy-3,3'-dimethyldiphenyl methane; 4,4'-dihydroxydiphenyl cyclohexane; 4,4'-dihydroxy-3,3'-dimethyldiphenyl propane; 4,4'-dihydroxydiphenyl sulfone; or tris-(4-hydroxyphenyl)methane; fluorene containing epoxies, e.g., Shell HPT ™ -1079 diglycidyl 9,9-bis[4-hydroxyphenyl]fluorene; polyglycidyl ethers of the halogenation (e.g., chlorination and bromination) products of the above mentioned polyvalent phenols; and polyglycidyl ethers of novolacs (i.e. reaction products of monohydric or polyhydric phenols with aldehydes, formaldehyde in particular, in the presence of acid catalysts).

Other suitable compounds include the di- and polyglycidyl derivatives of aromatic amines obtained from the reaction between these aromatic amines and an epihalohydrin. Examples of such glycidylamines include, but are not limited to, N,N'-diglycidyl aniline;

N,N'-dimethyl-N,N'-diglycidyl-4,4'-diaminodiphenyl methane; N,N,N'-tetraglycidyl-4,4'-diaminodiphenyl methane (MY TM -720, /Ciba-Geigy, Inc.); N,N-diglycidylnapthalenamine [given the name of N-1-napthalenyl-N-(oxiranylmethyl) oxiranemethanamine by Chemical Abstracts 9th Coll. 8505F (1982–1979)]; and N,N,N'N'-tetraglycidyl-1,4-bis [α-(4aminophenyl)-α-methylethyl]benzene (EPON HPT TM -1072, Shell Chemical Co.). The polyglycidyl derivatives of aromatic aminophenols (glycidylamino-glycidyloxy benzene) as described in U.S. Pat. No. 2,951,825 are also suitable. U.S. Pat. No. 2,951,825 is hereby incorporated by reference. An example of these compounds is N,N-diglycidyl-4-glycidyloxybenzenamine (ERL TM -0510, Ciba-Geigy, Inc.).

Glycidyl esters and/or epoxycyclohexyl esters of aromatic polycarboxylic acids, for example phthalic acid diglycidyl ester, and glycidyl esters of the reaction product of 1 mole of an aromatic dicarboxylic acid anhyride groups, are also suitable.

Epoxy resin curing agents that can be used in the curable epoxy resin composition of the present invention are well known in the art. Included among such curing agents are materials which are preferably acidic or alkaline. Examples of suitable curing agents include the polybasic acids and their anhydrides, for instance the di-, tri-, and higher carboxylic acids such as oxalic acid; pthalic acid; terepthalic acid; succinic acid; alkyl and alkenyl substituted succinic acids; tartaric acid; and polymerized unsaturated acids, such as those containing at least 10 carbon atoms, as for instance dodecendioic acid; 10,12-eicosadiendioic acid; polyhydric phenols such as resorcinol, catechol, hydroquinone, and phloroglucinol; novolacs and cresols such as D.E.H. 85 (Dow Chemical Co., Midland, Michigan); and anhydrides such as pthalic anhydride; succinic anhydride; malic anhydride; nadic anhydride; pyromellitic anhydride; and the like. Generally, from about 0.5 to 2.0 equivalents of acid, phenol, or anhydride are used per equivalent of epoxy group. With the phenols and anhydrides, an optional accelerator, in the range of 0.1 to 5.0 percent by weight of the total resin composition, may be present, e.g. an aromatic tertiary amine such as benzyldimethyl amine, or an imidazole such as 2-ethyl-4-methyl-imidazole.

Also useful as curing agents or supplementary curing agents are Lewis acids such as aluminum trichloride; aluminum tribromide; antimony pentafluoride; titanium tetrafluoride; boron trifluoride and its complexes such as $BF_3$-diethylether; and the like. It is also desirable at times that these Lewis acids be blocked to increase the latency of the compositions containing them. Representative of blocked Lewis acids are $BF_3$-monoethylamine and the adduct of $HSbF_5X$, in which X is —OH, halogen, or —OR in which R is an aliphatic or aromatic group, with aniline or a hindered amine as is described in U.S. Pat. No. 4,503,211 which is hereby incorporated by reference.

Other curing agents include the aliphatic amino-containing compounds, such as diethylenetriamine; triethylenetetraamine; dicyandiamide; imidazoles such as 2-ethyl-4-methyl-imidazole; melamine; pyridine; cyclohexylamine; benzyldimethylamine; benzylamine; diethylaniline; triethanolamine; piperidine; tetramethylpiperamine; N,N-dibutyl-1,3-propane diamine; N,N-diethyl-1,3-propane diamine; 1,2-diamino-2-methylpropane; 2,3-diamino-2-methyl-butane; 2,3-diamino-2-methylpentane; 2,4-diamino-2,6-dimethyl-octane; dibutylamine; and dioctylmine; and the aromatic polyamines such as o-, m-, and p-phenylene diamine; 4,4'-diaminodiphenyl sulfone; 3,3'-diaminodiphenyl sulfone; 4,4'-diaminodiphenyl sulfide; 4,4'-diaminodiphenyl ketone; 4,4'-diaminodiphenyl ether; 4,4'-diaminodiphenyl methane; 1,3-propanediol-bis(4aminobenzoate); 1,4-bis-[α-4-aminophenyl)-α-methylethyl]benzene (EPON HPT TM -1061, Shell Chemical Co.); 1,4-bis[α-4-amino-3,5-dimethylphenyl)-α-methylethyl]benzene (EPON HPT TM -1062, Shell Chemical Co.); bis(4-amino-3-methylphenyl)sulfone; 1,1'-biphenyl-3,3'-dimethyl-4,4'-diamine; 1,1'-biphenyl-3,3'-dimethoxy-4,4'-diamine; and diaminonapthalenes.

The preferred curing agents are the aromatic fluorene polyamines, such as 9,9-bis(4-aminophenyl)fluorene; 9,9-bis(3-methyl-4-aminophenyl)fluorene; 9,9-bis(3,5-dimethyl-4-aminophenyl)fluorene; and 9,9-bis(3-chloro-4-aminophenyl)fluorene which are described in U.S. Pat. No. 4,684,678.

Where the curing agent is an amino compound there is generally used an amount of amino compound to provide an equivalent concentration of amine hydrogen and epoxy groups. However, amino-containing curing agent sufficient to provide 0.1 to 2.0 or more amine hydrogens per epoxy group can be used. Where the curing agent is based on a Lewis acid, there is used from about 0.1 to 5.0 percent by weight based on total weight of the composition, exclusive of any solvents.

Various adjuvants can also be added to the epoxy resin composition to alter the characteristics of either the uncured or cured composition, or both. Included among useful adjuvants are thixotropic agents such as fumed silica; pigments to enhance color tones such as ferric oxide, brick dust, carbon black, and titanium oxide; fillers such as silica, magnesium sulfate, calcium sulfate, and beryllium aluminum silicate; clays such as bentonite; glass, ceramic and polymeric hollow microspheres; glass beads; thermoplastic polymers, and rubbery heterophases. Amounts of up to about 100 parts by weight of adjuvant per 100 parts by weight epoxy resin composition can be used, depending on the particular adjuvant.

While any epoxy resin composition comprising one or more polyepoxides, one more curing agents, and optional adjuvants in which the Tg of the cured epoxy resin composition is at least 175° C. is useful in the present invention, certain compositions are preferred. Such preferred compositions are comprised of a fluorene-containing component such as the polyepoxide or the curing agent. The inclusion of a fluorene-containing component enables the formulation of epoxy resins which, when cured, are characterized by relatively high Tg's, increased ductility (crack resistance), and low moisture absorption. Furthermore, such compositions allow for rigid thick film processing as well as fabrication of the cured epoxy resin substrates.

Figure 2:
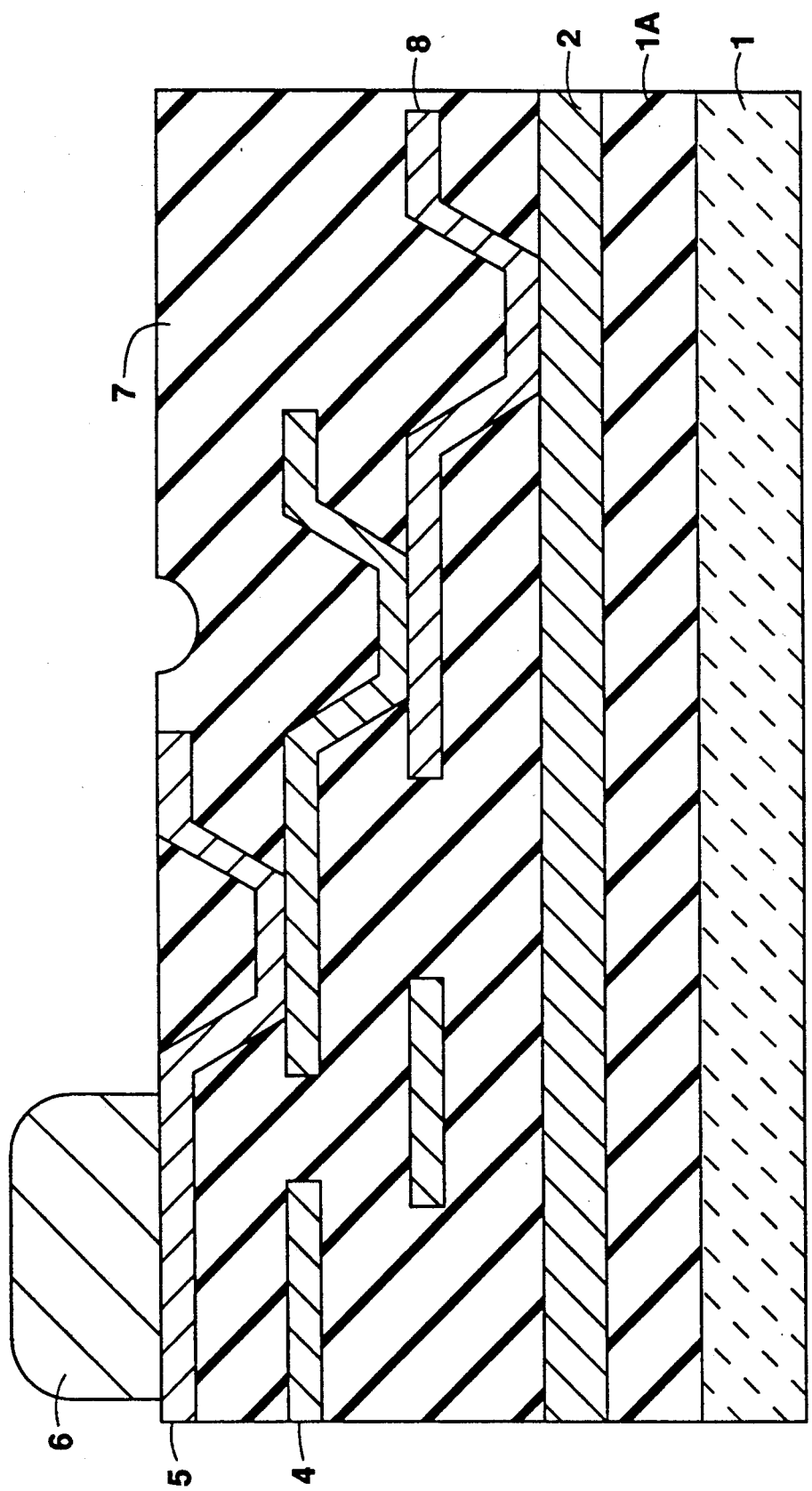
FIG. 2 shows an alternative circuit structure.

FIG. 1 illustrates an interconnect device according to the preferred embodiment. The embodiment illustrated in FIG. 1 incorporates the stacked vias 9. Alternatively, staggered vias 8 (FIG. 2) may be utilized. The fabrication is performed on a base substrate 1 which may be ceramic, semi-conductor such as silicon, or a cured epoxy resin. If the base 1 is electrically conductive then an insulator such as polyimide layer 1A may be coated thereon. A bottom reference (ground/power) plane 2 may be utilized in connection with an X-conductor signal level 3 and a Y-conductor signal level 4. A top reference (ground/power) plane 5 (FIG. 2) may be incorporated along with a bonding/termination layer 6. The dielectric material 7 is a cured epoxy resin and preferably a fluorene-containing resin.

Figure 3A:
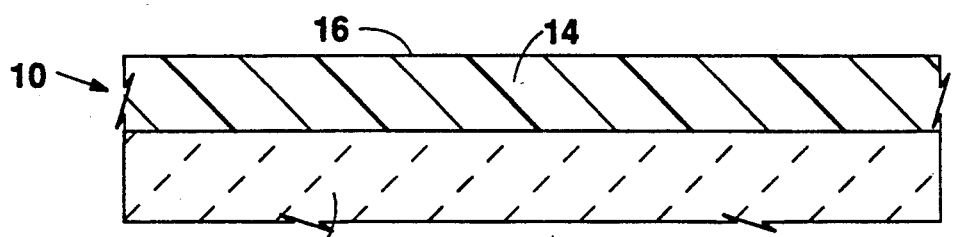
FIGS. 3A-3L show elevational cross sectional views of a method of fabricating a copper/cured epoxy resin structure, illustrating successive stages in the manufacturing process.

A method for making a Copper/epoxy structure is now described. Referring now to FIG. 3A, reference numeral 10 generally indicates any suitable substrate. Preferably substrate 10 includes a ceramic base 12, such as alumina ceramic or glass covered with a starting cured epoxy resin layer 14 having a polished surface 16. Cured epoxy resin layer 14 may have any suitable thickness, such as 10 um. However, substrate 10 may be of other materials, such as a silicon base with other dielectrics, or substrate 10 may be composed entirely of cured epoxy resin.

Figure 3B:
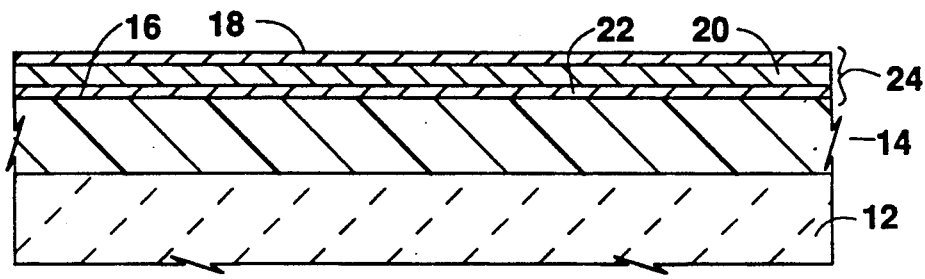

FIG. 3B shows a plating interconnect 24 consisting of layers 18, 20 and 22 deposited on surface 16. Preferably a sputter deposited titanium layer 18, copper layer 20, and titanium layer 22 is used. Bottom titanium layer 22 is used as an adhesion layer for the plating interconnect copper layer 20 and top titanium layer 22 is used as a protective coat to prevent copper layer 20 from oxidizing after deposition. For instance, titanium layers 18 and 22 can be 500 angstroms thick and copper layer 20 may be 2500 angstroms thick. Other suitable plating interconnects 24 may consist of trilayers of chromium/copper/chromium, chromium/copper/titanium, or refractory metal/gold.

Figure 3C:
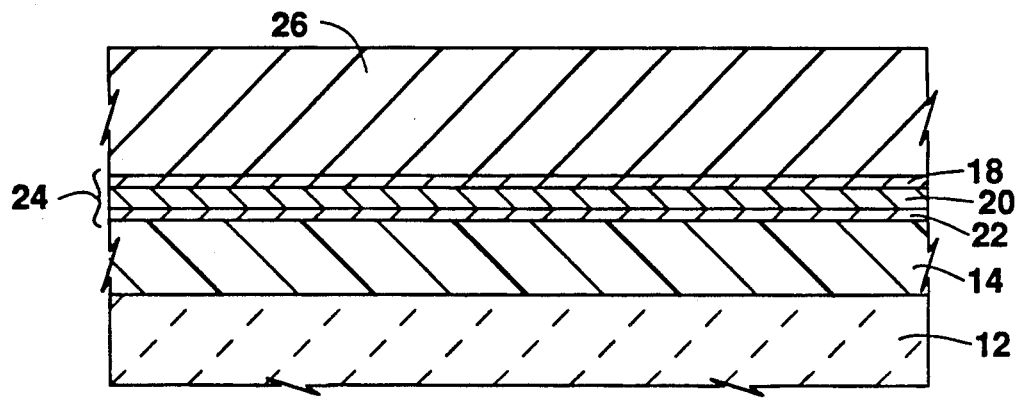
Figure 3D:
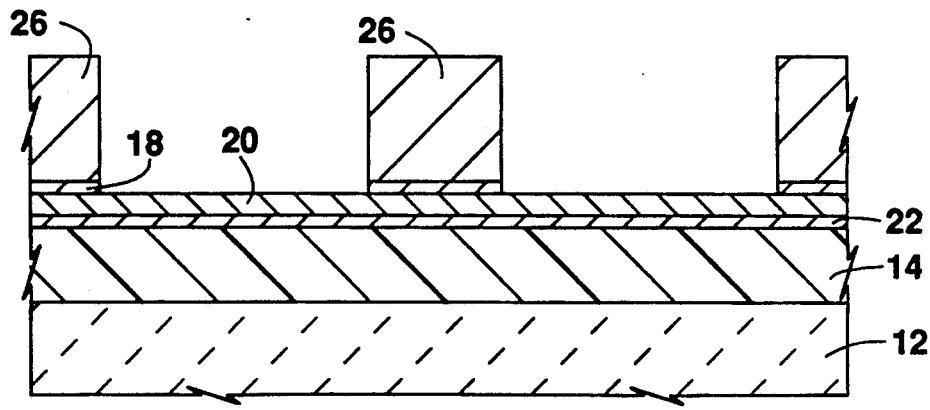

FIG. 3C shows a conventional plating mask of photoresist 26 formed over top titanium layer 18. As shown in FIG. 3D, photoresist 26 can be patterned through standard lithographic methods to provide selected openings therein for pattern plating a copper feature, such as a reference plane, x-line or y-line. Top titanium layer 18 is stripped in a mild solution, such as 0.5% hydrofluoric solution using the plating mask 26 as a mask, thereby forming a pattern for a copper conductor to be electroplated to copper layer 20. Copper is the preferred electrical conductor.

Figure 3E:
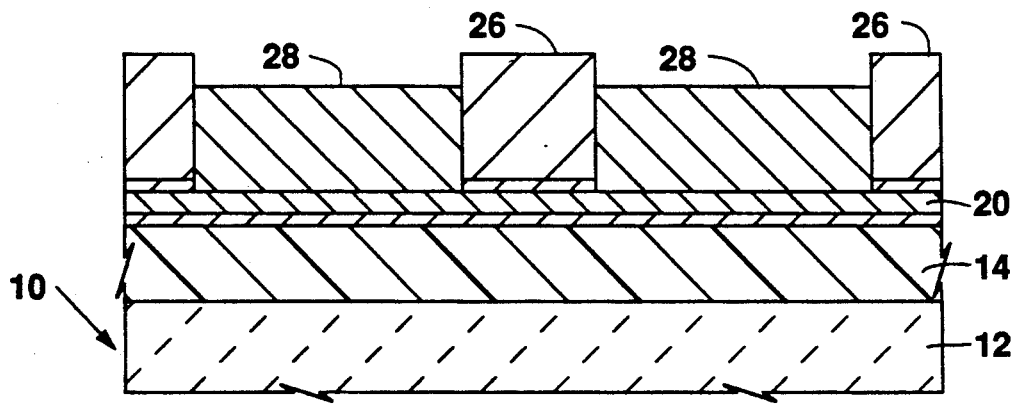
Figure 3F:
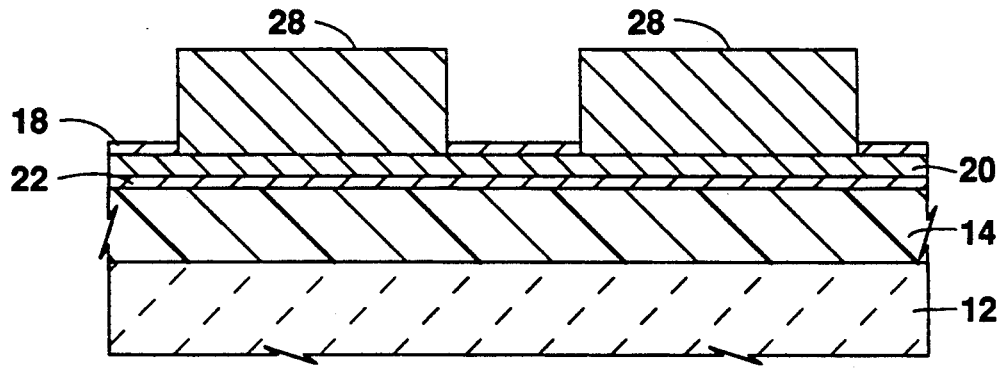

In FIG. 3E copper feature 28, for example a conductor line, is plated to the copper layer 20 in the patterned openings formed by the photoresist 26. Copper feature 28 can be plated by any suitable method, including electroplating and electroless deposition. In FIG. 3F photoresist 26 has been stripped as is conventional.

Figure 3G:
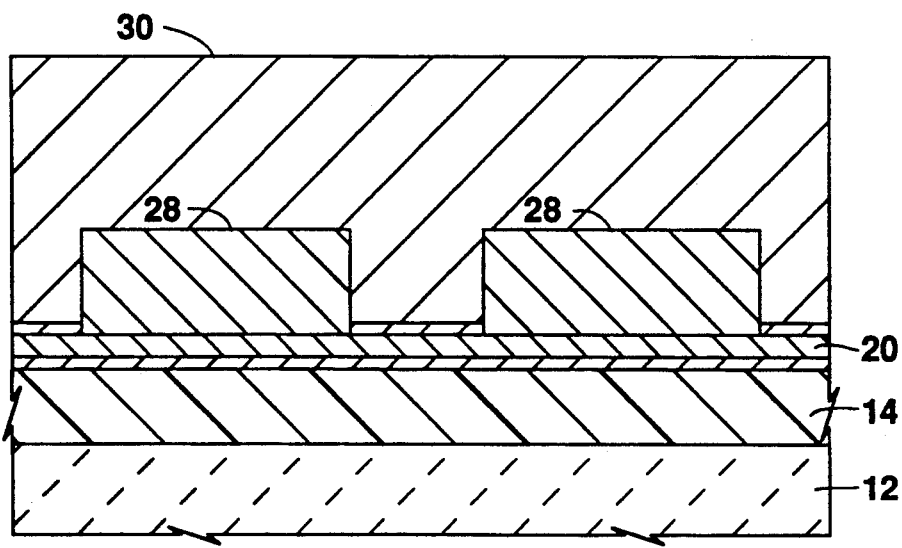
Figure 3K:
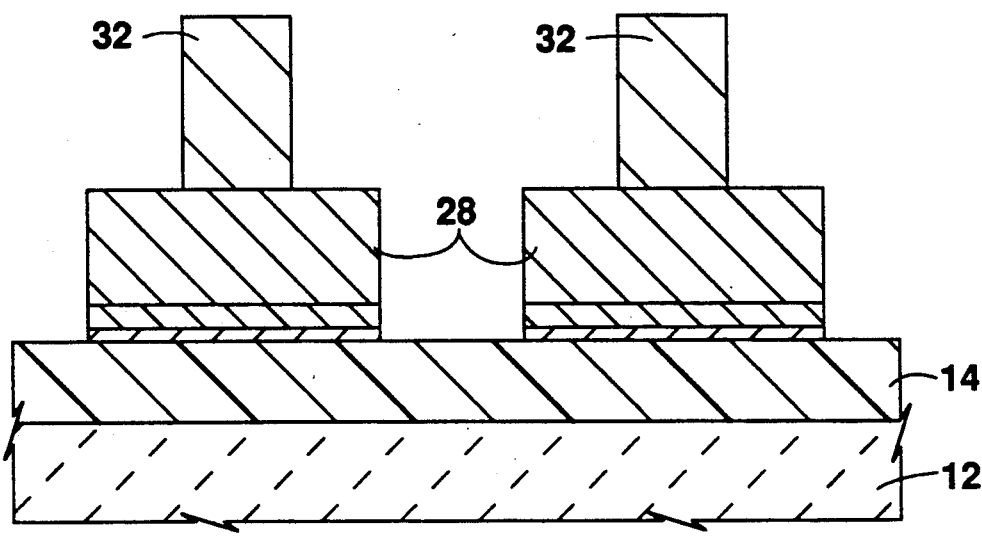

In FIG. 3G a pillar plating mask shown as a thick layer of photoresist 30 is formed on top of copper feature 28. In FIG. 3H photoresist 30 is patterned as is conventional to form patterns for plating an electrically conductive metal pillar or via onto the copper feature 28. Applicant prefers the term "pillar" to "via" since vias are typically formed using substractive processes whereas pillars are typically formed using additive processes such as described herein.

Figure 3L:
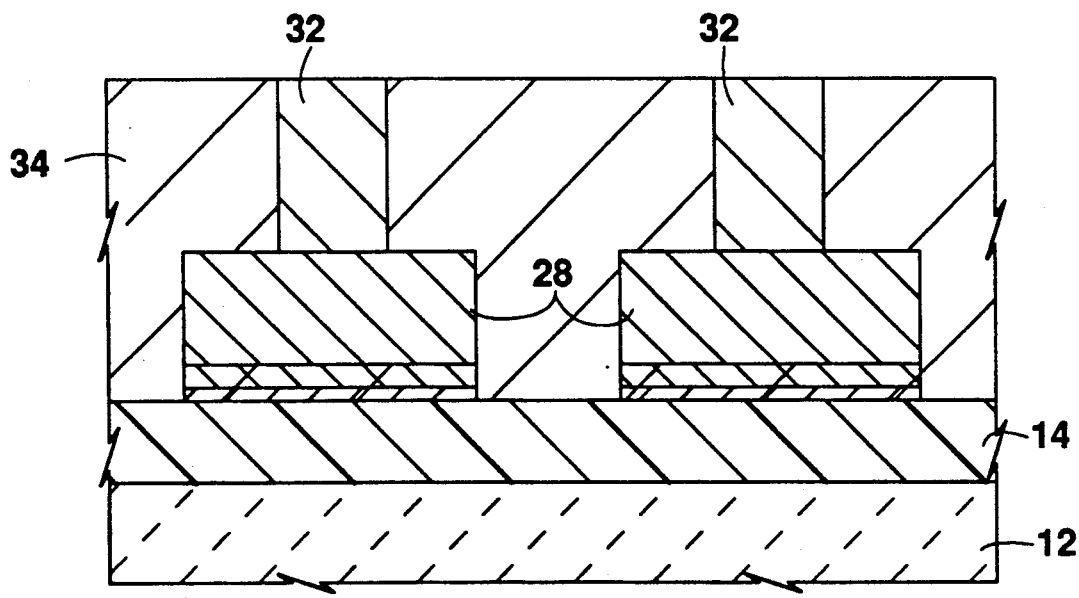
Figure 3H:
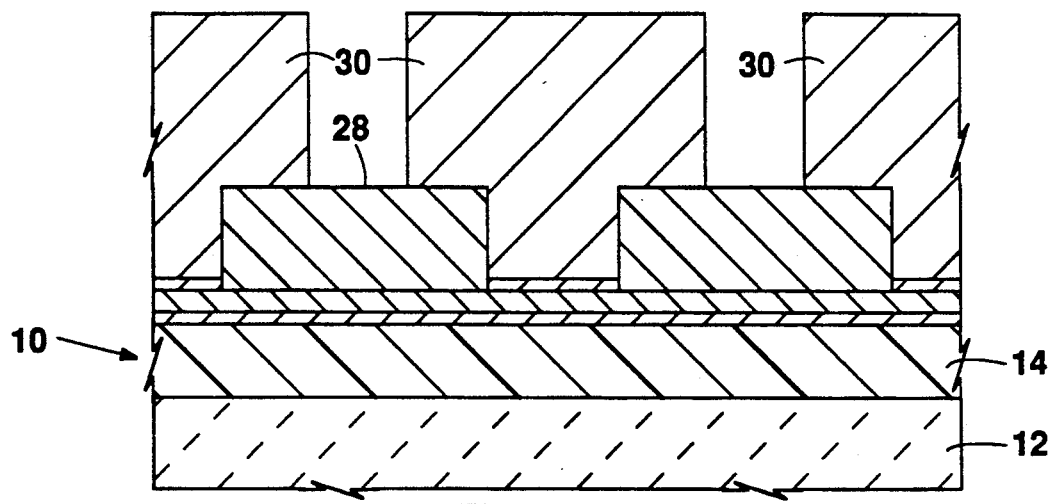
Figure 3I:
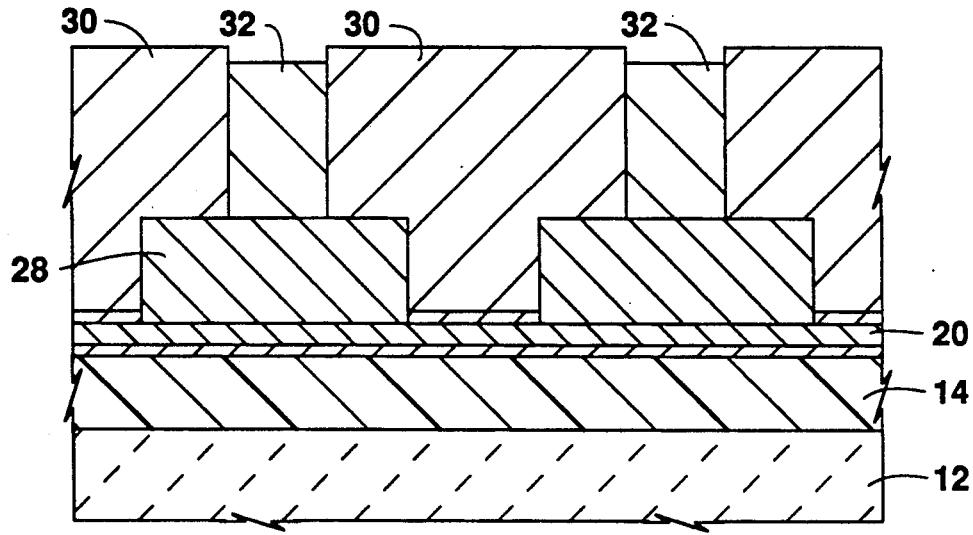
Figure 3J:
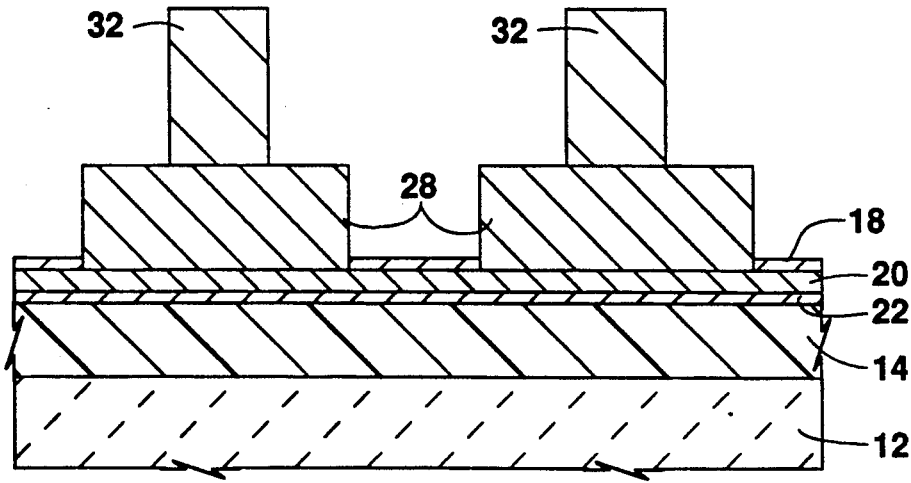

As shown in FIG. 3I, copper pillar 32 is plated into an opening in photoresist 30 onto the top of copper feature 28. Pillar 32 can be plated by any suitable method, including electroplating and electroless deposition. In FIG. 3J photoresist 30 has been stripped as is conventional leaving pillar 32 securely attached to copper feature 28. Surfaces on copper pillar 32, copper feature 28, and top titanium layer 18 are exposed. In FIG. 3K the remaining plating interconnect 24 consisting of titanium 18, copper 20 and titanium 22 not beneath a copper feature 28 is stripped to disconnect connections between adjacent copper feature 28.

Thereafter, as shown in FIG. 3L substrate 10 is ready for conventional deposition of epoxy resin, curing, and polishing for planarization. The preferred method of applying the epoxy resin dielectric over the conductors is spin coating from a liquid suspension or solution. Alternative methods include even distribution of a powder to the conductor surface, application of an uncured or partially cured epoxy resin in a film form, and spray coating. Planarization methods for the cured epoxy resin include polishing and chemical etchback. Mechanical polishing is preferred and is well understood by those skilled in the art due to the widespread use of cured epoxy resins as encapsulants. Chemical etchback using a plasma reactive ion etch (RIE) system with oxygen/fluorine plasma is also suitable.

More levels of conductors and reference planes can be fabricated by repeating the above-described sequence of operations. A preferred multilayer structure includes a first set of essentially parallel wire segments arranged in a first layer, a second set of essentially parallel wire segments perpendicular to the first layer, and a dielectric separating the wire segments and the layers.

Additional details for additive substrate fabrication are disclosed in prior art methods for fabricating copper/polyimide multilayer structures, such as U.S. Pat. No. 4,810,332 and U.S. Ser. No. 07/426,629 filed Oct. 24, 1989. The disclosures for both references are hereby incorporated by reference. While an additive method of fabricating a copper/epoxy structure has been described, numerous substractive fabrication techniques well known to those skilled in the art can also be applied to fabricate the present invention copper/epoxy structures.

Initial copper/epoxy structures fabricated on epoxy substrates by the applicant were found to crack. Hot plate bakes were eliminated after it was discovered that the 65 mil thick epoxy substrates bowed while on hot plates due to the thermal gradient from the bottom to the top of the epoxy substrate. The cured epoxy resin substrates flattened out immediately when removed from the hot plate, but the copper conductors on the surface of the wafer could be affected (compressed) by the bow to cause cracking. Consequently, convection bakes replaced all hot plate bakes to eliminate substrate bow. A suitable cure profile was found to be 15 minutes at 60° C. in a vacuum oven, followed by 4 hours at 200° C. in a convection oven.

The cured epoxy resin substrate has a potential drawback in that the thermal conductivity of such a substrate is relatively poor. This mean that conventional "through-the-substrate" heat dissipation methods used for silicon and other thermally conductive materials cannot be used. To demonstrate a potential solution to the thermal transmission problem, 100 1 mm diameter holes were drilled into a cured epoxy resin substrate in a 10 hole by 10 hole array, with a 1 cm spacing between holes. A small stub of 50/50 indium/lead wire was placed in each hole and melted at 150° C. to form a solid metal plug therein. It is expected that thermal vias like metal plugs could be used to move heat through the epoxy substrate if through-the-substrate heat transfer is desired. The heat transfer efficiency using filled through-holes has not been quantified and will be highly dependent on the heat transfer properties of the thermal conductor used to fill the holes.

In one experiment applicant calculated the stress of the cured epoxy resin film from bow measurements on a silicon wafer. The film stress was calculated to be $3.03 +/- 0.28 \times 10^8$ dynes per square centimeter for a film cured at 200° C. The stress was tensile, causing the thin silicon wafer to bow towards the cured epoxy film.

Assuming the observed wafer bow was caused only by thermal stress, the coefficient of thermal expansion (TCE) of the epoxy was calculated to be $60 \times 10^{-6}/°C$.

Applicant has found that by matching the TCE of the substrate to the TCE of the dielectric, TCE mismatch concerns within an interconnect system can be greatly reduced. However, there are still concerns about the TCE mismatch between a copper/epoxy interconnect module and the chips to be attached to the top of the module. The TCE of a copper/epoxy module is dominated by the TCE of the epoxy, at about $60 \times 10^{-6}/°C$. Silicon has a TCE of $2.5 \times 10^{-6}/°C$, and GaAs has a TCE of $5.8 \times 10^{-6}/°C$. To accommodate this TCE mismatch between a copper/epoxy interconnect and a silicon or GaAs chip mounted thereon, a compliant method of chip attachment is preferred. Compliant TAB or "flip chip"bonding are some of the possible chip attachment methods that allow for TCE differences. In the event a die attach is positioned between a chip and a copper/epoxy interconnect, the die attach materials should be carefully chosen to prevent cracking or separation of the die attach.

Applicant has also found that the adhesion of the cured epoxy resin film to itself and other materials is excellent. Applicant attempted to quantify adhesion, but in all cases the adhesion at the cured epoxy resin interface was better than the adhesion of any other interface in the test structure so no adhesion strengths at the cured epoxy resin interfaces could be measured. Although cured epoxy resin adheres to most materials, it was not found that most materials adhere to cured epoxy resin. For instance, sputtered metal films were not found to adhere well to cured epoxy resin films unless the cured epoxy resin films were pretreated with a plasma roughening step or a generous backsputter step just prior to sputter deposition. It was also found to be critical to clean the cured epoxy resin substrates with a solvent to remove all traces of mold release agent prior to sputter deposition.

The present invention copper/epoxy multilayer interconnect system has been tested by applicant to establish environmental stability and material system integrity. Environmental stress tests similar to those used for military qualification and based on MIL-STD-883C were used. The tests included thermal shock, moisture resistance, temperature 85° C./humidity 85° C. (TH), chemical resistance, high temperature storage, and autoclave testing. The tests demonstrated that the copper-/epoxy substrates were visually unchanged and electrically continuous after environmental stress testing.

The invention described herein is by way of example. The invention is not limited to the embodiments illustrated in the drawings or the examples set forth. Numerous changes may be made and are contemplated as being within the spirit and scope of the invention as defined by the claims attached hereto. Furthermore the invention is not limited to integrated circuit interconnect devices. Utilization of the claimed method and structure for various other applications is within the scope of the invention.

What is claimed is:

1. A multilayer circuit comprising:
   a substrate;
   a first cured epoxy resin dielectric layer on said substrate wherein the thermal coefficient of expansion of said first cured epoxy resin dielectric layer and said substrate are matched;
   at least two high density circuit pattern layers located above said first cured epoxy resin dielectric layer wherein said circuit pattern layers exhibit a conductor line density of greater than 300 lines per inch per level; and
   a second cured epoxy resin dielectric layer located between said circuit pattern layers.

2. A circuit according to claim 1 wherein said circuit pattern layers are copper layers.

3. A circuit according to claim 1, further comprising
   a circuit power layer located above said circuit pattern layers; and
   an additional cured epoxy resin dielectric layer separating said circuit power layer from said circuit pattern layers.

4. A circuit according to claim 1 further comprising at least one interconnection extending through said second cured epoxy resin dielectric layer between said circuit pattern layers.

5. A circuit according to claim 1 wherein said substrate is a cured epoxy resin.

6. A circuit according to claim 5 wherein the thermal coefficient of expansion of said cured epoxy resin substrate and said first cured epoxy resin dielectric layer is about $60 \times 10^{-6}/°C$.

7. A circuit according to claim 5 wherein said cured epoxy resin substrate and said first cured epoxy resin dielectric layer are the same epoxy resin.

8. A circuit according to claim 7 wherein said second cured epoxy resin dielectric layer is said same epoxy resin.

9. A circuit according to claim 1 wherein said conductor line density is over 500 lines per inch per level.

10. A high density interconnect device, comprising:
    a substrate;
    a high density interconnect circuit pattern located on said substrate wherein said circuit pattern exhibits a conductor line density of over 300 lines per inch per level; and
    a cured epoxy resin dielectric surrounding said circuit pattern wherein said cured epoxy resin has a glass transition temperature of at least 175° C.

11. A device according to claim 10 wherein said circuit pattern comprises
    a first set of essentially parallel wire segments arranged in a first layer;
    a second set of essentially parallel wire segments perpendicular to said first set and arranged in a second layer; and
    a plurality of interconnections between said first set and said second set; wherein
    said cured epoxy resin dielectric separates said wire segments and said layers.

12. A device according to claim 10 wherein said circuit pattern comprises copper lines.

13. A device according to claim 10 wherein the substrate is a cured epoxy resin.

14. A device according to claim 11 wherein said conductor line density is over 500 lines per inch per level.

15. The invention according to claims 1 or 2 or 3 or 4 or 5 or 6 or 7 or 8 or 9 or 10 or 11 or 12 or 13 or 14 wherein the cured epoxy resin contains a fluorene-containing polyepoxide.

16. The invention according to claim 15 wherein the cured epoxy resin contains an adjuvant.

17. The invention according to claim 15 wherein the cured epoxy resin has a glass transition temperature of at least 175° C.

18. The invention according to claim 15 wherein the cured epoxy resin dielectric contains a plurality of hollow glass microspheres which reduce the dielectric constant thereof.

19. A high density interconnect device, comprising:
a substrate;
a high density interconnect circuit pattern located on said substrate wherein said circuit pattern exhibits a conductor line density of over 300 lines per inch per level; and
a cured epoxy resin dielectric surrounding said circuit pattern wherein said cured epoxy resin contains a fluorene-containing polyepoxide.

20. A high density interconnect device, comprising:
a substrate;
a high density interconnect circuit pattern located on said substrate wherein said circuit pattern exhibits a conductor line density of over 300 lines per inch per level; and
a cured epoxy resin dielectric surrounding said circuit pattern wherein said cured epoxy resin contains an adjuvant.

21. A device according to claim 20 wherein said adjuvant is a plurality of hollow glass microspheres which reduce the dielectric constant of the cured epoxy resin.

22. A high density interconnect device, comprising:
a substrate;
a high density interconnect circuit pattern located on said substrate wherein said circuit pattern exhibits a conductor line density of over 300 lines per inch per level; and
a cured epoxy resin dielectric surrounding said circuit pattern.

* * * * *